US012629626B2

(12) United States Patent
Yan et al.

(10) Patent No.: US 12,629,626 B2
(45) Date of Patent: May 19, 2026

(54) AIR PURIFIER

(71) Applicant: SHENZHEN PUREMATE TECHNOLOGY CO., LTD., Shenzhen (CN)

(72) Inventors: Fangsheng Yan, Shenzhen (CN); Xiang Zheng, Shenzhen (CN); Bo Yang, Shenzhen (CN); Shengbin Wen, Shenzhen (CN)

(73) Assignee: SHENZHEN PUREMATE TECHNOLOGY CO., LTD., Shenzhen (CN)

( * ) Notice: Subject to any disclaimer, the term of this patent is extended or adjusted under 35 U.S.C. 154(b) by 149 days.

(21) Appl. No.: 18/419,795

(22) Filed: Jan. 23, 2024

(65) Prior Publication Data

US 2025/0133666 A1 Apr. 24, 2025

(30) Foreign Application Priority Data

Oct. 19, 2023 (CN) .......................... 202322806604.2

(51) Int. Cl.
| | |
|---|---|
| *B01D 46/44* | (2006.01) |
| *H05K 5/00* | (2006.01) |
| *H05K 5/02* | (2006.01) |

(52) U.S. Cl.
CPC ........... *B01D 46/44* (2013.01); *H05K 5/0018* (2022.08); *H05K 5/0247* (2013.01)

(58) Field of Classification Search
CPC ..... H05K 5/0018; H05K 5/0247; B01D 46/44
See application file for complete search history.

(56) References Cited

U.S. PATENT DOCUMENTS

| | | | | |
|---|---|---|---|---|
| 2015/0153048 A1* | 6/2015 | Moro | ...................... | F23N 5/203 |
| | | | | 99/332 |
| 2020/0150766 A1* | 5/2020 | Bagley | .................. | G06F 3/0362 |
| 2023/0216363 A1* | 7/2023 | Hobbs | ................ | H02K 11/0094 |
| | | | | 310/67 R |
| 2023/0261425 A1* | 8/2023 | Sun | ........................ | H01R 43/20 |
| | | | | 439/607.05 |

FOREIGN PATENT DOCUMENTS

| | | | | |
|---|---|---|---|---|
| CN | 205353833 | U | * | 6/2016 |
| CN | 218769224 | U | * | 3/2023 |
| CN | 220379903 | U | * | 1/2024 |
| CN | 222210664 | U | * | 12/2024 |

* cited by examiner

*Primary Examiner* — Kenneth Bukowski
(74) *Attorney, Agent, or Firm* — Westbridge IP LLC

(57) ABSTRACT

An air purifier includes a housing, a main circuit board provided in the housing, and an adjustment assembly including a display screen, a display circuit board, an encoder, a knob assembly, a first flexible flat cable, a second flexible flat cable, and a fixed connection board provided with a cable threading hole. The encoder includes a fixed seat and a rotation sleeve sleeved on the fixed seat. The knob assembly is formed with an installation cavity inside which accommodates the display screen, the fixed connection board and the encoder. The fixed seat is connected to housing, the fixed connection board is connected to a side of the fixed seat away from housing; the display screen is connected to a side of the fixed connection board away from housing, and the display circuit board is connected to a side of the display screen facing the fixed connection board.

10 Claims, 8 Drawing Sheets

AIR PURIFIER

CROSS-REFERENCE TO RELATED APPLICATIONS

This application claims priority to Chinese Patent Application No. 202322806604.2, filed on Oct. 19, 2023, the entire contents of which are incorporated herein by reference.

TECHNICAL FIELD

The present application relates to the technical field of air purifying, and in particular to an air purifier.

BACKGROUND

In order to reduce wire connections in the knob assembly of the air purifier in the related art, the connection circuit board is provided on the fixed seat of the encoder, the fixed seat and the display circuit board are both electrically connected to the connection circuit board by wires, and the connection circuit board and the main circuit board are electrically connected by wires. However, the setting of the connection circuit board makes the electrical connection between the display circuit board and the main circuit board to be a rigid connection, that is, when the adjustment assembly is knocked and the connection circuit board is loose, the electrical connection between the display circuit board and the main circuit board will become loose, and as a result, the service life of the adjustment assembly is reduced.

SUMMARY

The main objective of the present application is to provide an air purifier, aiming to prolong the service life of the adjustment assembly.

To achieve the above objective, the air purifier proposed by the present application includes a housing, a main circuit board provided in the housing, and an adjustment assembly. The adjustment assembly includes a display screen, a display circuit board, a fixed connection board, an encoder, a knob assembly, a first flexible flat cable and a second flexible flat cable. The encoder includes a fixed seat and a rotation sleeve sleeved on the fixed seat. The knob assembly is formed with an installation cavity inside, and the display screen, the fixed connection board and the encoder are located in the installation cavity. The fixed seat is connected to the housing, and the fixed connection board is connected to a side of the fixed seat away from the housing. The display screen is connected to a side of the fixed connection board away from the housing, and the display circuit board is connected to a side of the display screen facing the fixed connection board. The fixed connection board is provided with a cable threading hole. One end of the first flexible flat cable is electrically connected to the display circuit board, and the other end of the first flexible flat cable is threaded through the cable threading hole and electrically connected to the main circuit board. One end of the second flexible flat cable is electrically connected to the fixed seat, and the other end of the second flexible flat cable is threaded through the cable threading hole and electrically connected to the main circuit board.

In some embodiments, a diameter of the cable threading hole ranges from 15 mm to 25 mm.

In some embodiments, the knob assembly includes a knob ring. The knob ring is formed with the installation cavity, and the knob ring is sleeved on a periphery surface of the display screen and drivingly connected to the rotation sleeve.

In some embodiments, the knob assembly further includes a transmission member. The transmission member is provided on the rotation sleeve, and the knob ring is provided on the transmission member. The knob ring is drivingly connected to the rotation sleeve via the transmission member, and the transmission member and the knob ring are enclosed to form the installation cavity.

In some embodiments, one of the transmission member and the rotation sleeve is provided with a first clamping catch, the other of the transmission member and the rotation sleeve is provided with a first clamping groove, and the transmission member is connected to the rotation sleeve via the first clamping catch and the first clamping groove.

In some embodiments, the transmission member includes a first sleeve, a second sleeve and a ring-shaped connection board. One end of the ring-shaped connection board is connected to the first sleeve, and the other end of the ring-shaped connection board is connected to the second sleeve. The first sleeve is connected to the knob ring, and the second sleeve is connected to the rotation sleeve. The ring-shaped connection board and the fixed connection board are spaced apart, and a diameter of the ring-shaped connection board is configured to gradually increase along a direction from the second sleeve to the first sleeve.

In some embodiments, a distance between the ring-shaped connection board and the fixed connection board is defined as s, and $0 < s \leq 2$ mm.

In some embodiments, the fixed connection board is provided with soldering holes, a side of the fixed seat facing the fixed connection board is provided with a soldering board, and the soldering board is soldered to the soldering holes.

In some embodiments, a side of the display screen facing the fixed connection board is provided with restriction columns, and a periphery surface of the display circuit board is provided with restriction holes. The restriction columns are restricted to the restriction holes, and the display circuit board is adhered to the display screen.

In some embodiments, the fixed connection board is provided with installation holes, and the restriction columns are each provided with a threaded hole. One installation hole corresponds to one threaded hole, and the display screen is fastened to the fixed connection board via the threaded holes, the installation holes and screws.

In some embodiments, the adjustment assembly further includes a connection support; the fixed seat is fixed to the housing via the connection support, one of the connection support and the fixed seat is provided with a second restriction protrusion, and the other is provided with a second restriction groove: the connection support is restricted and installed to the fixed seat by a cooperation of the second restriction protrusion and the second restriction groove.

In the technical solution of the present application, the air purifier includes a housing, a main circuit board and an adjustment assembly. The main circuit board is provided in the housing. The adjustment assembly includes a display screen, a display circuit board, a fixed connection board, an encoder, a knob assembly, a first flexible flat cable and a second flexible flat cable. The encoder includes a fixed seat and a rotation sleeve sleeved on the fixed seat. The knob assembly is formed with the installation cavity inside, and the display screen, the fixed connection board and the encoder are arranged in the installation cavity. In this way, the display screen is allowed to be integrated into the knob assembly inside the knob assembly, thereby reducing the space occupied by the display screen. Furthermore, the fixed seat is connected to the housing, the fixed connection board is connected to a side of the fixed seat away from the housing, the display screen is connected to a side of the fixed connection board away from the housing, the display circuit board is connected to a side of the display screen facing the fixed connection board. The fixed connection board is provided with a cable threading hole. One end of the first flexible flat cable is electrically connected to the display circuit board, and the other end of the first flexible flat cable is threaded through the cable threading hole to be electrically connected to the main circuit board. One end of the second flexible flat cable is electrically connected to the fixed seat, and the other end of the second flexible flat cable is threaded through the cable threading hole to be electrically connected to the main circuit board. By providing the cable threading hole on the fixed connection board, the fixed seat and the display circuit board are thus allowed to be electrically connected to the main circuit board directly via the first flexible flat cable and the second flexible flat cable, respectively, thereby reducing the possibility of the electrical connection between the display circuit board and the fixed seat and the main circuit board becoming loose resulting from the adjustment assembly being knocked, and prolonging the service life of the adjustment assembly.

BRIEF DESCRIPTION OF THE DRAWINGS

In order to more clearly illustrate the technical solutions in the embodiments of the present application or in the related art, drawings that are needed to illustrate the embodiments or the related art are simply introduced below. Obviously, drawings introduced below are just some of the embodiments in the present application. For those of ordinary skilled in the art, other figures can be further obtained without creative efforts according to the structures shown in drawings below.

FIG. 5 is a schematic structural view of a transmission member in the air purifier according to an embodiment of the present application.

Figure 1:
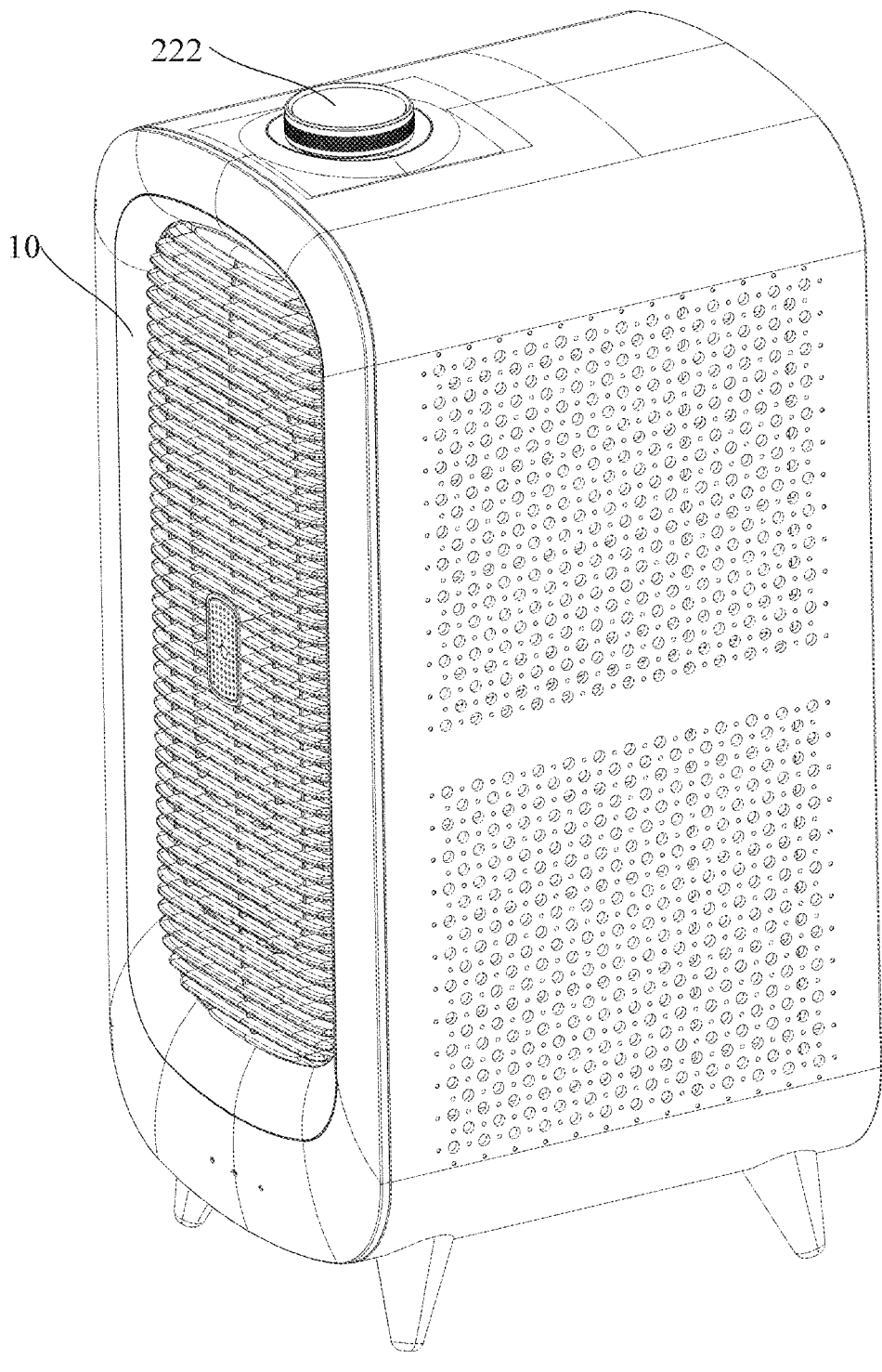
FIG. 1 is a schematic structural view of an air purifier according to an embodiment of the present application.

The realization of the purpose, the functional feature, and the advantage of present application will be further illustrated in conjunction with the embodiments and referring to the drawings.

DETAILED DESCRIPTION OF THE EMBODIMENTS

The technical solutions of the embodiments of the present application will be clearly and completely described below in conjunction with the drawings in the embodiments of the present application. It is obvious that the embodiments to be described are only some rather than all the embodiments of the present application. All other embodiments obtained by those of ordinary skilled in the art based on the embodiments of the present application without creative efforts should fall within the scope of the present application.

It should be noted that all the directional indications (such as up, down, left, right, front, rear, etc.) in the embodiments of the present application are only used to explain the relative positional relationship, movement, etc. among the components in a certain posture (as shown in the drawings). If the specific posture changes, the directional indication will change accordingly. In the present application, unless otherwise specifically specified and limited, the terms "connected", "fixed", etc. should be understood in a broad sense, for example, "fixed" can be a fixed connection, a detachable connection, or be integrated as a whole: "connected" can be a mechanical connection or an electrical connection: can be directly connected, or indirectly connected through an intermediate medium, or can be the internal communication between two elements or the interaction relationship between two elements. For those of ordinary skilled in the art, the specific meaning of the above-mentioned terms in the present application can be understood according to specific situations.

Besides, the descriptions associated with "first", "second", etc. in the present application are merely for descriptive purposes, and cannot be understood as indicating or suggesting the relative importance or implicitly indicating the number of the indicated technical feature. Therefore, the features defined with "first" or "second" can expressly or implicitly include at least one such feature. In addition, the meaning of "and/or" appearing in the present application includes three solutions. For example, "A and/or B" includes only A, or only B, or both A and B. Moreover, the technical solutions of the various embodiments can be combined with each other, but the combinations must be based on the realization by those of ordinary skilled in the art. When the combination of technical solutions is contradictory or cannot be achieved, it should be considered that such a combination of technical solutions does not exist, nor does it fall within the scope of the present application.

Figure 2:
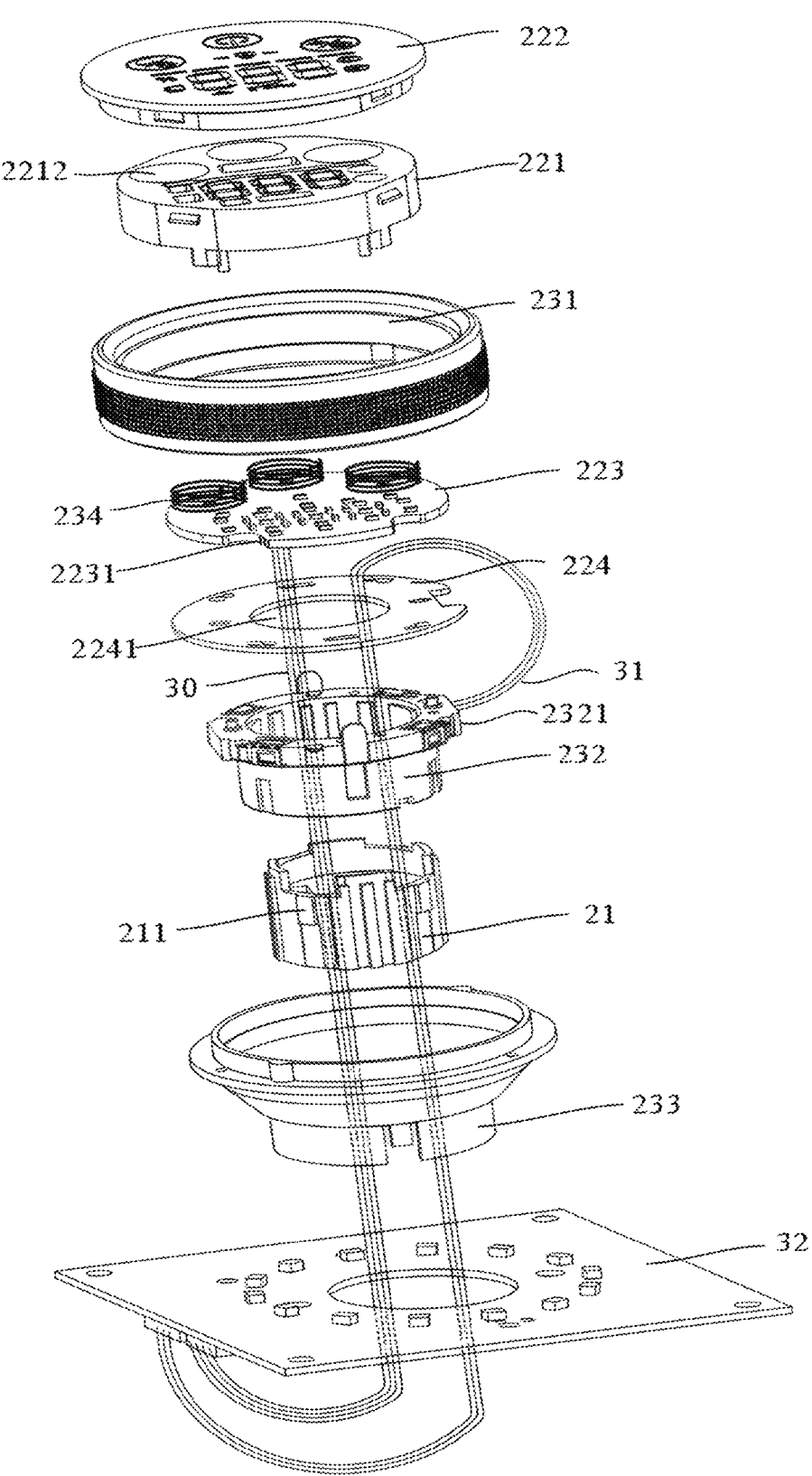
FIG. 2 is an exploded view of an air purifier according to an embodiment of the present application.
Figure 3:
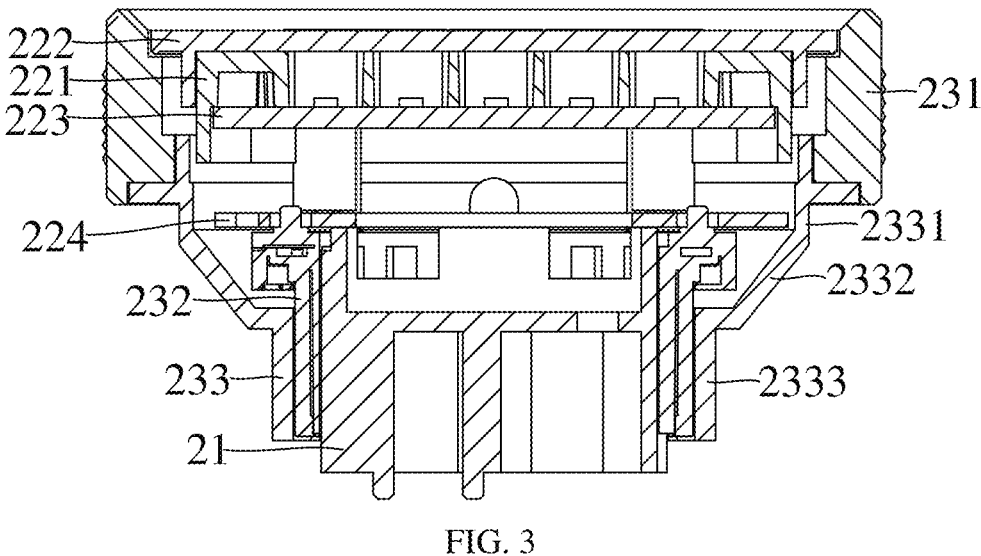
FIG. 3 is a cross-sectional view of the air purifier according to an embodiment of the present application.

Referring to FIGS. 1 to 3, the present application provides an air purifier, which includes a housing 10, a main circuit board 32 provided in the housing 10, and an adjustment assembly. The adjustment assembly includes a display screen, a display circuit board 223, a fixed connection board 224, an encoder 232, a knob assembly, a first flexible flat cable 30) and a second flexible flat cable 31. The encoder 232 includes a fixed seat 2321 and a rotation sleeve 2322 sleeved on the fixed seat 2321. The knob assembly is formed with an installation cavity inside, and the display screen, the fixed connection board 224 and the encoder 232 are arranged in the installation cavity. The fixed seat 2321 is connected to the housing 10, the fixed connection board 224 is connected to a side of the fixed seat 2321 away from the housing 10, the display screen is connected to a side of the fixed connection board 224 away from the housing 10, the display circuit board 223 is connected to a side of the display screen facing the fixed connection board 224, the fixed connection board 224 is provided with a cable threading hole 2241, one end of the first flexible flat cable 30 is electrically connected to the display circuit board 223, and the other end of the first flexible flat cable 30 is threaded through the cable threading hole 2241 to be electrically connected to the main circuit board 32. One end of the second flexible flat cable 31 is electrically connected to the fixed seat 2321, and the other end of the second flexible flat cable 31 is threaded through the cable threading hole 2241 to be electrically connected to the main circuit board 32.

The air purifier in the technical solution of the present application includes the housing 10, the main circuit board 32 and the adjustment assembly. The main circuit board 32 is provided in the housing 10. The adjustment assembly includes the display screen, the display circuit board 223, the fixed connection board 224, the encoder 232, the knob assembly, the first flexible flat cable 30) and the second flexible flat cable 31. The encoder 232 includes the fixed seat 2321 and the rotation sleeve 2322 sleeved on the fixed seat 2321. The knob assembly is formed with the installation cavity inside, and the display screen, the fixed connection board 224 and the encoder 232 are arranged in the installation cavity. In this way, the display screen is allowed to be integrated into the knob assembly inside the knob assembly, thereby reducing the space occupied by the display screen. Furthermore, the fixed seat 2321 is connected to the housing 10, the fixed connection board 224 is connected to a side of the fixed seat 2321 away from the housing 10, the display screen is connected to a side of the fixed connection board 224 away from the housing 10, the display circuit board 223 is connected to a side of the display screen facing the fixed connection board 224, the fixed connection board 224 is provided with the cable threading hole 2241, one end of the first flexible flat cable 30 is electrically connected to the display circuit board 223, and the other end of the first flexible flat cable 30 is threaded through the cable threading hole 2241 to be electrically connected to the main circuit board 32: one end of the second flexible flat cable 31 is electrically connected to the fixed seat 2321, and the other end of the second flexible flat cable 31 is threaded through the cable threading hole 2241 to be electrically connected to the main circuit board 32. By providing the cable threading hole 2241 on the fixed connection board 224, the fixed seat 2321 and the display circuit board 223 are thus allowed to be electrically connected to the main circuit board 32 directly via the first flexible flat cable 30) and the second flexible flat cable 31, respectively, thereby reducing the possibility of the electrical connection between the display circuit board 223 and the fixed seat 2321 and the main circuit board 32 becoming loose resulting from the adjustment assembly being knocked, and prolonging the service life of the adjustment assembly.

Specifically, the adjustment assembly can be used for adjusting the air output size, the air output humidity, the brightness of the display screen, the opening size of the aromatherapy box at the air outlet, and other air output parameters of the air purifier.

Figure 6:
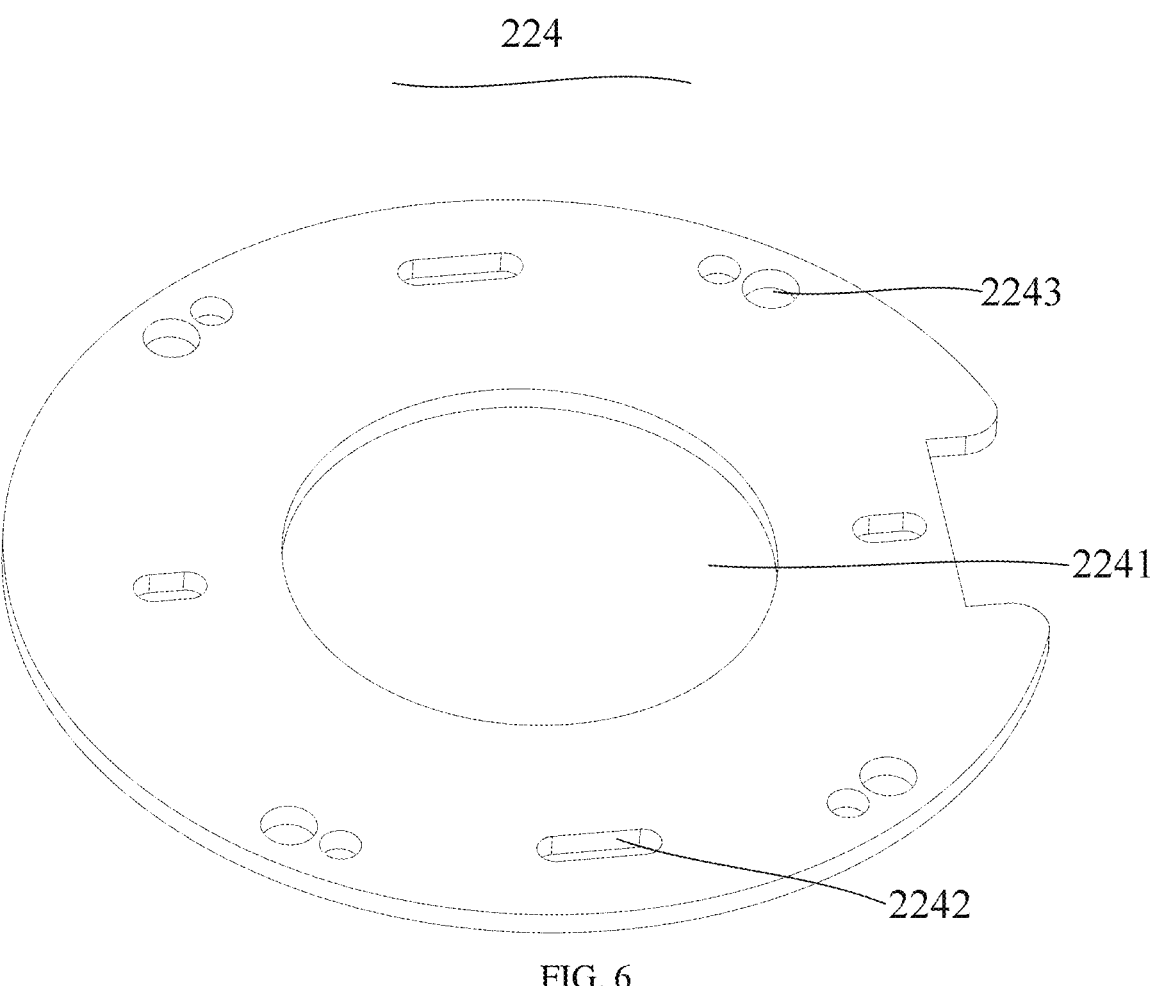
FIG. 6 is a schematic structural view of a fixed connection board in the air purifier according to an embodiment of the present application.

Referring to FIG. 6, in an embodiment, the diameter of the cable threading hole 2241 ranges from 15 mm to 25 mm. In this way, not only the first flexible flat cable 30 and the second flexible flat cable 31 are allowed to have a certain movement space, but also the shaking amplitude of the first flexible flat cable 30 and the second flexible flat cable 31 is reduced, thereby reducing the possibility of the electrical connection between the display circuit board 223 and the fixed seat 2321 and the main circuit board 32 becoming loose, and prolonging the service life of the adjustment assembly.

Figure 7:
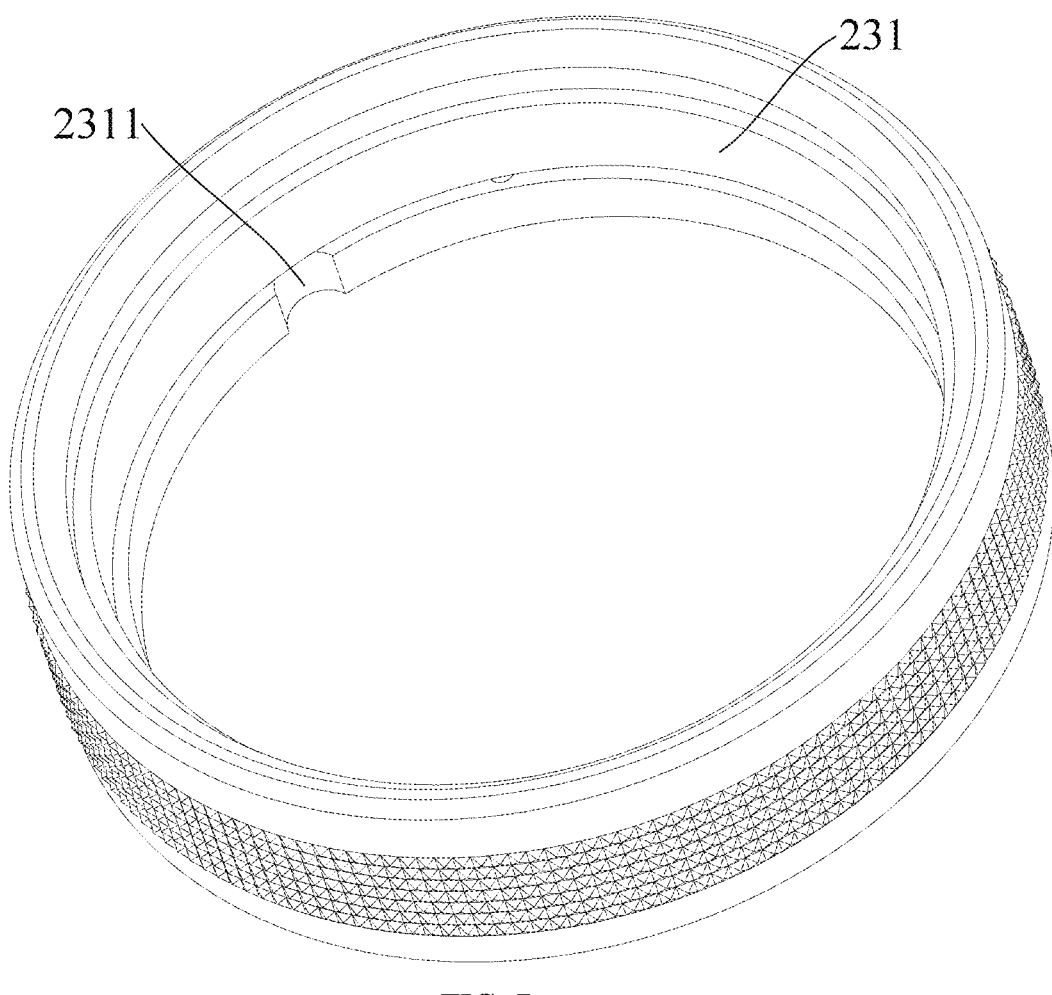
FIG. 7 is a schematic structural view of a knob ring in the air purifier according to an embodiment of the present application.
Figure 8:
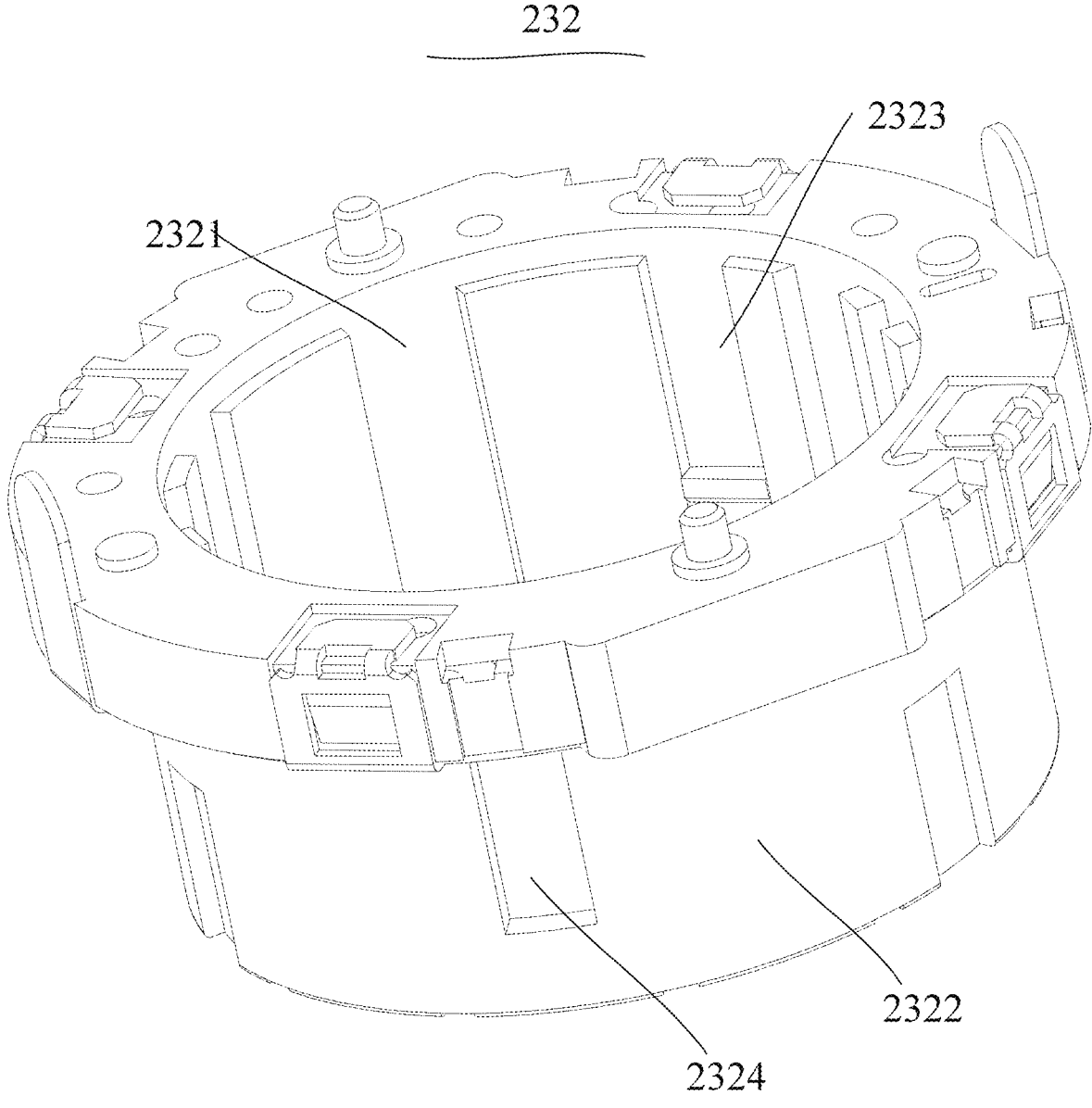
FIG. 8 is a schematic structural view of an encoder in the air purifier according to an embodiment of the present application.

Referring to FIGS. 2, 3 and 7, in an embodiment, the knob assembly includes a knob ring 231, the knob ring 231 is formed with the installation cavity. The knob ring 231 is sleeved on a periphery surface of the display screen and drivingly connected to the rotation sleeve 2322. When the user rotates the knob ring 231 to drive the rotation sleeve 2322 to rotate, the fixed seat 2321 of the encoder 232 obtains the rotation information of the rotation sleeve 2322, the rotation information is then transmitted to the main circuit board 32, and triggering corresponding functions.

Referring to FIGS. 2, 3, 5 and 8, in an embodiment, the knob assembly further includes a transmission member 233, the transmission member 233 is provided on the rotation sleeve 2322, the knob ring 231 is provided on the transmission member 233, the knob ring 231 is drivingly connected to the rotation sleeve 2322 via the transmission member 233, and the transmission member 233 and the knob ring 231 enclose to form the installation cavity. By using the transmission member 233 to realize the drive connection between the knob ring 231 and the rotation sleeve 2322, the transmission path is increased. Additionally, since the user will often touch the knob ring 231, and the knob ring 231 protrudes from the surface of the housing 10, the knob is thus easily damaged. Therefore, by providing the knob ring 231 and the transmission member 233 separately, it is thus beneficial to replace the knob, which reduces the daily use and maintenance cost.

In an embodiment, one of the transmission member 233 and the rotation sleeve 2322 is provided with a first clamping catch 2335, and the other is provided with a first clamping groove 2324. The transmission member 233 is connected to the rotation sleeve 2322 via the first clamping catch 2335 and the first clamping groove 2324. After the first clamping catch 2335 on the transmission member 233 and the first clamping groove 2324 on the rotation sleeve 2422 are aligned, inserting the transmission member 233 to the rotation sleeve 2322 upwards along the axis of the knob ring 231 until the first clamping catch 2335 is abutted against the groove wall of the first clamping groove 2324. In this way, the transmission member 233 is restricted in the circumferential direction, and is only restricted in one direction in the axial direction, which is beneficial for the installation and removal of the transmission member 233 and the rotation sleeve 2322. The clamping restriction method of the first clamping catch 2335 and the first clamping groove 2324 is stable and reliable, the connection is convenient and the cost is low.

In an embodiment, one of the knob ring 231 and the transmission member 233 is provided with a first restriction protrusion 2334, and the other is provided with a first restriction groove 2311. The knob ring 231 is restricted to the transmission member by the cooperation of the first restriction protrusion 2334 and the first restriction groove 2311. The first restriction protrusion 2334 and the first restriction groove are extended radially, and this allows that when rotating the knob ring 231, the transmission member 233 can be driven to rotate by the cooperation of the first restriction protrusion 2334 and the first restriction groove 2311, which increases the synchronicity between the knob ring 231 and the transmission member 233, reduces the possibility of slippage between the knob ring 231 and the transmission member 233, improves the stability between the knob ring 231 and the transmission member 233, and improves the control accuracy of the knob ring 231.

In an embodiment, the periphery surface of the knob ring 231 is provided with a plurality of anti-slip protrusions at intervals, which facilitates the user to rotate the knob ring

231, improving the friction of the periphery surface of the knob ring 231, and improving the user's experience.

In an embodiment, the adjustment assembly further includes a connection support 21, the fixed seat 2321 is fixed to the housing 10 via the connection support 21. One of the connection support 21 and the fixed seat 2321 is provided with a second restriction protrusion 211, and the other is provided with a second restriction groove 2323. The connection support 21 is restricted and installed to the fixed seat 2321 by the cooperation of the second restriction protrusion 211 and the second restriction groove 2323. There can be multiple second restriction protrusions 211 and second restriction grooves 2323 arranged with intervals, one second restriction protrusion 211 corresponds to one second restriction groove 2323, and the length and width of multiple second restriction protrusions 211 may differs from each other. In this way, the connection support 21 is thus restricted to the fixed seat 2321 via the second restriction protrusions 211 and the second restriction grooves 2323, and the connection support 21 is allowed to be inserted into the fixed seat 2321 only along the axial direction of the knob ring 231. The structures of the second restriction protrusion 211 and the second restriction groove 2323 are simple, the installation is convenient, and the connection strength is high.

Figure 5:
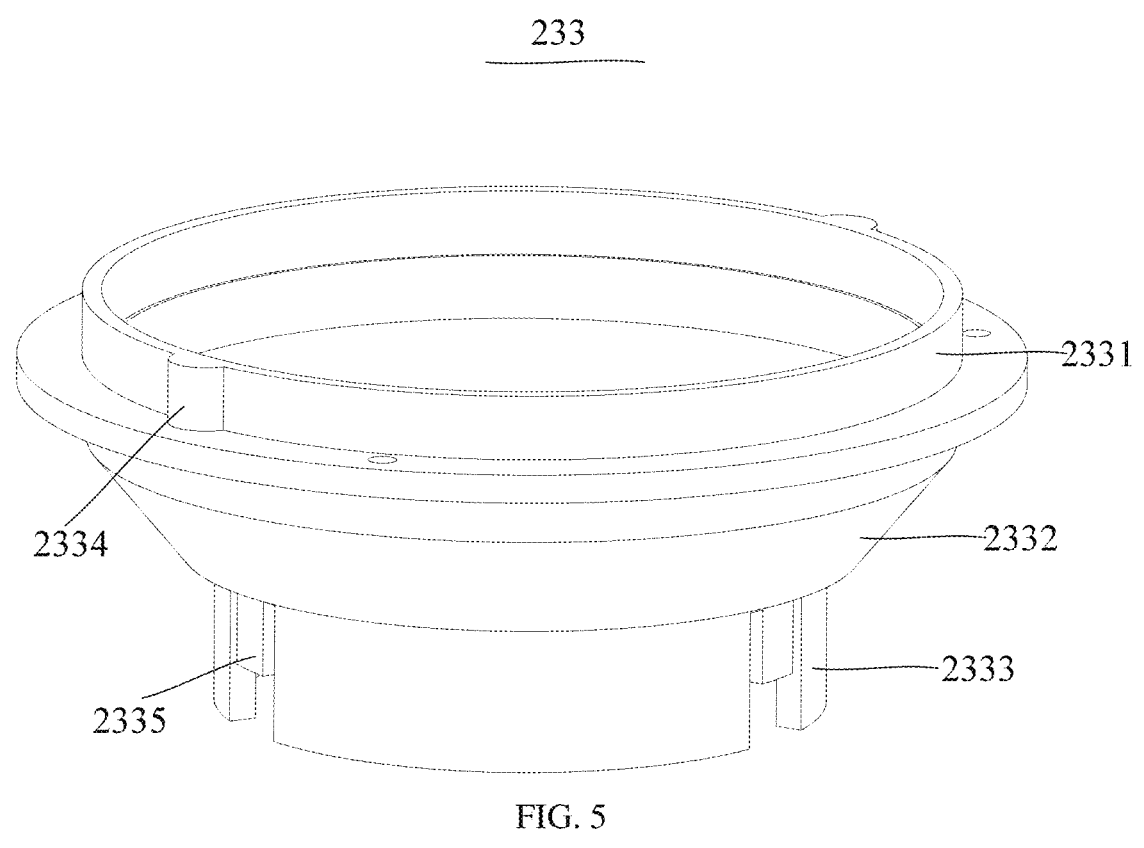

Referring to FIGS. 3 and 5, in an embodiment, the transmission member 233 includes a first sleeve 2331, a second sleeve 2333 and a ring-shaped connection board 2332. One end of the ring-shaped connection board 2332 is connected to the first sleeve 2331, and the other end is connected to the second sleeve 2333. The first sleeve 2331 is connected to the knob ring 231, and the second sleeve 2333 is connected to the rotation sleeve 2322. The ring-shaped connection board 2332 and the fixed connection board 224 are spaced apart, and the diameter of the ring-shaped connection board 2332 is configured to gradually increase along the direction from the second sleeve 2333 to the first sleeve 2331. It can be understood that since the adjustment assembly protrudes from the surface of the housing 10, the adjustment assembly is easily knocked by other objects. In this condition, the first sleeve 2331 and the ring-shaped connection board 2332 can also play a restriction role for the fixed connection board 224, avoiding the adjustment assembly from being greatly offset when being knocked, thereby prolonging the service life of the adjustment assembly.

In an embodiment, the distance between the ring-shaped connection board 2332 and the fixed connection board 224 is defined as s, and 0<s≤2 mm. When s is 0), then when the knob ring 231 drives the transmission member 233 to rotate, a friction will occur between the transmission member 233 and the fixed connection board 224, thereby generating noise and also increasing the force of the user to rotate the knob ring 231, which reduces the user's experience. When s is greater that 2 mm, the distance between the ring-shaped connection board 2332 and the fixed connection board 224 is relatively large, and the ring-shaped connection board 2332 cannot play a support role on the fixed connection board 224, thereby reducing the reliability of the adjustment assembly.

In an embodiment, the fixed connection board 224 is provided with soldering holes 2242. One side of the fixed seat 2321 facing the fixed connection board 224 is provided with a soldering board, and the soldering board is soldered to the soldering hole 2242. The soldering board and the soldering hole 2242 can play a certain restriction role, but also, the connection strength between the fixed connection board 224 and the fixed seat 2321 is further improved by soldering the soldering board to the soldering hole 2242. Meanwhile, the soldering process is mature, and connection strength is high, thereby reducing the manufacturing cost and improving the connection strength between the fixed connection board 224 and the fixed seat 2321.

Figure 4:
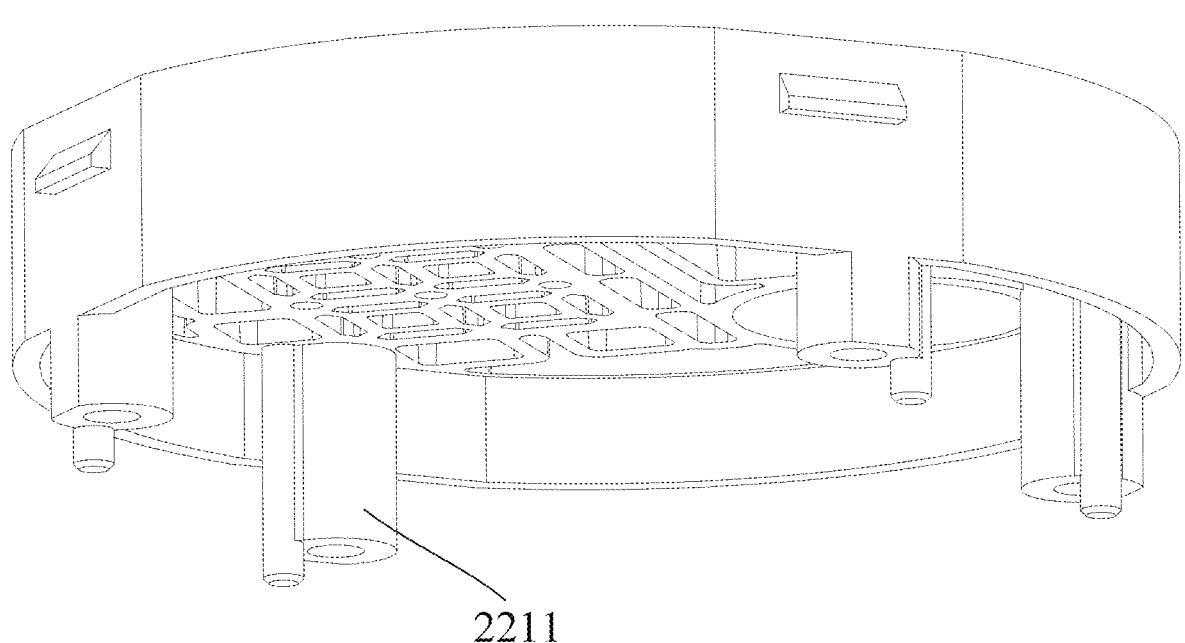
FIG. 4 is a schematic structural view of a display screen body in the air purifier according to an embodiment of the present application.

Referring to FIGS. 2 and 4, in an embodiment, one side of the display screen facing the fixed connection board 224 is provided with restriction columns 2211, and the periphery surface of the display circuit 223 is provided with restriction holes 2231. The restriction columns 2211 is restricted in the restriction holes 2231, and the display circuit board 223 is adhered to the display screen. The display circuit board 223 is adhered to one side of the display screen facing the fixed connection board 224. The stability of the display circuit board 223 is further increased by the cooperation of the restriction columns 2211 and restriction holes 2231, and the possibility of the display circuit 223 becoming loose is reduced, thereby improving the stability of the adjustment assembly.

In an embodiment, the fixed connection board 224 is provided with installation holes 2243, the restriction columns 2211 are each provided with a threaded hole inside. One installation hole 2243 corresponds to one threaded hole. The display screen is fastened to the fixed connection board 224 via the threaded holes, the installation holes 2243 and screws. The method of using screws to fasten is stable and reliable, the connection strength is high, the installation is convenient, and the cost is low.

In an embodiment, the adjustment assembly further includes springs 234, the display screen includes a display screen body 221 and a touch display panel 222 provided on the display screen body. The touch display panel 222 has a press zone and a display zone on it. The display screen body 221 is provided with spring trough holes 2212, the spring trough holes 2212 are configured to correspond to the press zone. The springs 234 are arranged in the spring through holes 2212, one end of the spring is electrically connected to the touch display panel 222, and the other end of the spring is electrically connected to the display circuit 223. The springs 234 play a conductive role for the electrical connection between the touch display panel 222 and the display circuit 223, and the electrical connection between touch display panel 222 and the display circuit 223 is thus a flexible connection, thereby increasing the stability of the electrical connection between the touch display panel 222 and the display circuit 223 and prolonging the service life of the adjustment assembly.

The above-mentioned are only some preferred embodiments of the present application, and are not intended to limit the scope of the present application. Any structural variation made by using the specification and the content of the drawings of the present application, or direct/indirect application on other related technical fields, should all be included in the scope of the present application.

What is claimed is:

1. An air purifier, comprising:
a housing;
a main circuit board provided in the housing; and
an adjustment assembly comprising a display screen, a display circuit board, a fixed connection board, an encoder, a knob assembly, a first flexible flat cable and a second flexible flat cable;
wherein the encoder comprises a fixed seat and a rotation sleeve sleeved on the fixed seat; the knob assembly is formed with an installation cavity inside, and the display screen, the fixed connection board and the encoder are located in the installation cavity; the fixed seat is connected to the housing, and the fixed connection board is connected to a side of the fixed seat away from the housing; the display screen is connected to a side of the fixed connection board away from the housing, and the display circuit board is connected to a side of the display screen facing the fixed connection board; the fixed connection board is provided with a cable threading hole; one end of the first flexible flat cable is electrically connected to the display circuit board, and the other end of the first flexible flat cable is threaded through the cable threading hole and electrically connected to the main circuit board; one end of the second flexible flat cable is electrically connected to the fixed seat, and the other end of the second flexible flat cable is threaded through the cable threading hole and electrically connected to the main circuit board;

wherein a side of the display screen facing the fixed connection board is provided with restriction columns, and a periphery surface of the display circuit board is provided with restriction holes; the restriction columns are restricted to the restriction holes, and the display circuit board is adhered to the display screen.

2. The air purifier according to claim 1, wherein a diameter of the cable threading hole ranges from 15 mm to 25 mm.

3. The air purifier according to claim 1, wherein the knob assembly comprises a knob ring, the knob ring is formed with the installation cavity, and the knob ring is sleeved on a periphery surface of the display screen and drivingly connected to the rotation sleeve.

4. The air purifier according to claim 3, wherein the knob assembly further comprises a transmission member; the transmission member is provided on the rotation sleeve, and the knob ring is provided on the transmission member; the knob ring is drivingly connected to the rotation sleeve via the transmission member, and the transmission member and the knob ring are enclosed to form the installation cavity.

5. The air purifier according to claim 4, wherein one of the transmission member and the rotation sleeve is provided with a first clamping catch, the other of the transmission member and the rotation sleeve is provided with a first clamping groove, and the transmission member is connected to the rotation sleeve via the first clamping catch and the first clamping groove.

6. The air purifier according to claim 4, wherein the transmission member comprises a first sleeve, a second sleeve and a ring-shaped connection board; one end of the ring-shaped connection board is connected to the first sleeve, and the other end of the ring-shaped connection board is connected to the second sleeve; the first sleeve is connected to the knob ring, and the second sleeve is connected to the rotation sleeve; the ring-shaped connection board and the fixed connection board are spaced apart, and a diameter of the ring-shaped connection board is configured to gradually increase along a direction from the second sleeve to the first sleeve.

7. The air purifier according to claim 6, wherein a distance between the ring-shaped connection board and the fixed connection board is defined as s, and 0<s≤2 mm.

8. The air purifier according to claim 1, wherein the fixed connection board is provided with soldering holes, a side of the fixed seat facing the fixed connection board is provided with a soldering board, and the soldering board is soldered to the soldering holes.

9. The air purifier according to claim 1, wherein the fixed connection board is provided with installation holes, and the restriction columns are each provided with a threaded hole; one installation hole corresponds to one threaded hole, and the display screen is fastened to the fixed connection board via the threaded holes, the installation holes and screws.

10. The air purifier according to claim 1, wherein the adjustment assembly further comprises a connection support; the fixed seat is fixed to the housing via the connection support, one of the connection support and the fixed seat is provided with a second restriction protrusion, and the other is provided with a second restriction groove; the connection support is restricted and installed to the fixed seat by a cooperation of the second restriction protrusion and the second restriction groove.

* * * * *